United States Patent [19]

Chung

[11] Patent Number: 5,646,070

[45] Date of Patent: Jul. 8, 1997

[54] METHOD OF FORMING CONDUCTIVE REGION ON SILICON SEMICONDUCTOR MATERIAL, AND SILICON SEMICONDUCTOR DEVICE WITH SUCH REGION

[75] Inventor: Henry Wei-Ming Chung, Cupertino, Calif.

[73] Assignee: Philips Electronics North American Corporation, Tarrytown, N.Y.

[21] Appl. No.: 400,778

[22] Filed: Mar. 6, 1995

Related U.S. Application Data

[63] Continuation of Ser. No. 82,324, Jun. 24, 1993, which is a continuation of Ser. No. 630,105, Dec. 19, 1990.

[51] Int. Cl.[6] .................... H01L 29/43; H01L 21/822
[52] U.S. Cl. .................... 437/200; 437/190; 437/192
[58] Field of Search .................... 437/200, 192, 437/193, 190; 257/757, 763, 770, 751

[56] References Cited

U.S. PATENT DOCUMENTS

| | | |
|---|---|---|
| 4,708,904 | 11/1987 | Shimizu et al. . |
| 4,818,723 | 4/1989 | Yen .......................... 437/200 |
| 4,851,369 | 7/1989 | Ellwanger et al. .......................... 437/192 |
| 4,892,843 | 1/1990 | Schmitz et al. .......................... 437/192 |
| 4,910,578 | 3/1990 | Okamoto .......................... 257/770 |
| 4,954,214 | 9/1990 | Ho .......................... 156/628 |
| 4,966,865 | 10/1990 | Welch et al. . |
| 5,023,201 | 6/1991 | Stanasolovich et al. .......................... 437/192 |
| 5,094,981 | 3/1992 | Chung et al. .......................... 437/200 |

FOREIGN PATENT DOCUMENTS

| | | | |
|---|---|---|---|
| 60-130825 | 7/1985 | Japan .......................... 437/192 |
| 63-58943 | 3/1988 | Japan . |
| 1-57664 | 3/1989 | Japan . |
| 1059954 | 3/1989 | Japan . |
| 1-160011 | 6/1989 | Japan .......................... 437/192 |
| 1-286447 | 11/1989 | Japan .......................... 437/200 |
| 1-321656 | 12/1989 | Japan . |
| 2106971 | 4/1990 | Japan . |
| 0341734 | 2/1991 | Japan . |
| 3-41734 | 2/1991 | Japan . |

OTHER PUBLICATIONS

S.-L. Zhang, et al. "Selective LPCVD-W Deposition on Silicides" Proc. 10th Int. Conf. on CVD1987 pp. 747-758.
S. Q. Wang, et al. "Reactions of Co/Mo Bilayers and Amorphous $Co_{50}Mo_{50}$ Alloy Films with Silicon" *Thin Solid Films* vol. 162 (1988) pp. 199-207.
Fann-Mei Yang et al. "Formation of Bilayer Shallow $MoSi_2$/$CoSi_2$ Salicide Contact Using W/Co-Mo Alloy" Jpn. J. Appl. Phys. vol. 31 (1992) pp. 1004-1011.
Park, et al. "Mo/Ti Bilayer Metallization for a Self-Aligned $TiSi_2$ Process", J. Vac. Sci. Tech. A2(2), Apr.-Jun. 1984 pp. 259-263.
Puppin, et al. "Annealing Behavior of Refractory Metal Multilayers on Si: The Mo/Ti and W/Ti Systems", J. Appl. Physics 63(7), 1 Apr. 1988 pp. 2414-2419.

(List continued on next page.)

*Primary Examiner*—John Niebling
*Assistant Examiner*—C. Everhart
*Attorney, Agent, or Firm*—Norman N. Spain

[57] ABSTRACT

A contact to a silicon semiconductor body is fabricated in a manner which merges the benefits of the low contact resistance provided by titanium silicide or cobalt silicide and the good step coverage provided by selective chemical vapor deposition (CVD) of tungsten or molybdenum from tungsten hexafluoride or molybdenum hexafluoride. An intermediate adhesion layer of molybdenum silicide or tungsten silicide is formed by physical vapor deposition, e.g., sputtering or vacuum evaporation, of molybdenum or titanium, followed by annealing. Such adhesion layer protects the underlying layer against damage by fluorine during CVD of the overlying layer of tungsten or molybdenum, as well as providing low resistance and good adhesion to both the underlying and overlying layers.

13 Claims, 3 Drawing Sheets

OTHER PUBLICATIONS

Ng, et al. "Interaction of CVD Tungsten with Underlying Metal Layers", *Tungsten and Other Refractory Metals for VLSI Applications*, Material Research Society 1987, Proc. 1986 Tungsten Workshop, Palo Alto, Ca. 12–14 Nov. 1986 pp. 93–99.

Moriya, et al. "A Planar Metallization Process—Its Application to Tri–Level Aluminum Interconnection" IEDM 83, pp. 550–553.

Ellwanger et al., Tungsten and Other Refractory Metals for VLSI Applications II (Mat. Res. Soc. 1987), Procs. 1986 Workshop, Palo Alto Nov. 1986, pp. 385–394.

Broadbent et al., J. Electrochem. Soc. 133, 1986, pp. 1715–1720.

Van der Putte et al., Applied Physics Letters 49(25), Dec. 1986, pp. 1723–1725.

METHOD OF FORMING CONDUCTIVE REGION ON SILICON SEMICONDUCTOR MATERIAL, AND SILICON SEMICONDUCTOR DEVICE WITH SUCH REGION

This is a continuation of application Ser. No. 08/082,324, filed on Jun. 24, 1993, which is a continuation of application Ser. No. 07/630,105, filed on Dec. 19, 1990.

FIELD OF USE

The invention relates to a method of forming a conductive region on silicon semiconductor material, and more particularly to a method of forming a contact with the semiconductor material. As used herein the expressions "silicon semiconductor material" and "silicon" refer to monocrystalline silicon as well as to non-monocrystalline (e.g., amorphous or polycrystalline) silicon.

BACKGROUND ART

In the field of silicon semiconductor device manufacturing, noble metal silicides, e.g., the silicides of titanium (Ti) and cobalt (Co), have been used to form contacts to a semiconductor region where a diffusion or an implantation has been previously done, and to polysilicon to provide low contact resistance or highly conductive interconnects. Titanium and cobalt are preferred because they offer low contact resistance with silicon. The electrical resistance of titanium silicide and of cobalt silicide are the lowest among noble- and refractory-metal silicides. Moreover, their silicides can be formed on silicon in a self-aligned manner. That is, these silicides can be formed at locations having predetermined chemical properties, thus rendering the use of an additional mask superfluous. Moreover, titanium silicide will be formed upon deposition of titanium on silicon even in the presence of an oxide layer over the silicon up to a thickness of approximately 40 angstroms, thereby avoiding the need for a separate oxide removal step, e.g. sputter-etch.

The refractory metals such as tungsten (W) and molybdenum (Mo) have received much attention as well because of their low electrical resistivities and favorable characteristics with regard to use as contact opening or via opening fills. The use of chemical vapor deposition (CVD) of tungsten for fabricating interconnections provides good step coverage. Also, tungsten and molybdenum, selectively deposited through the CVD process, can be used as a diffusion barrier, as a polysilicon shunt to reduce interconnection resistance, and as an interconnection in multi-level metallization.

In R. C. Ellwanger et al., Tungsten and Other Refractory Metals for VLSI Applications II (Mat. Res. Soc. 1987), Procs. 1986 Tungsten Workshop, Palo Alto, Calif., 12–14 Nov., 1986, pp. 385–394, it has been reported that selective growth of tungsten on top of monocrystalline silicon produces tunnel defect structures. Attempts to alleviate the potential reliability problems posed by such defect structures include growing tungsten onto regions where a silicide has previously been formed. The silicide enables low-resistance contacts to be achieved.

It would be highly desirable to merge the formation of titanium silicide or cobalt silicide with the CVD-tungsten step into a single process for reaping the fruits of both. However, such a merging would encounter a number of difficulties. Since CVD-tungsten involves fluorine chemistry, the vapor deposited substance may interact with the underlying silicide, thereby degrading the electrical properties such as contact conductivity and reliability.

In E. K. Broadbent. et al., J. Electrochem. Soc., 133, 1986, p. 1715, it is reported that titanium silicide is incompatible with CVD-tungsten using the source gas tungsten hexafluoride. The high reactivity of fluorine and titanium gives rise to the production of a highly resistive layer of non-volatile titanium tetrafluoride and therefore to high contact resistance. Alternatively, CVD-tungsten applied on cobalt silicide proceeds via the reduction of tungsten hexafluoride by consuming silicon from the silicide. In P. van der Putte et al., Appl. Phys. Lett. 49 (25), 22 Dec. 1986, pp. 1723–1725, the formation of local intrusions in the cobalt silicide layer is reported as a result of the CVD-tungsten, indicating encroachment of tungsten hexafluoride down the edge of the silicon-silicide interface. These and related silicide, as regards the undesirable susceptibility to the vapor chemistry associated with CVD processes, would therefore render such merging impractical.

In Ellwanger (op. cit.) a blanket CVD-tungsten process is reported, a major aspect whereof relates to the adhesion of CVD-tungsten to silicon oxide. The effect upon contact resistance to titanium silicide of this tungsten deposition process in combination with several adhesion layers to oxide is described. One of the combinations mentioned includes a tungsten silicide adhesion layer between titanium silicide and a CVD-tungsten blanket. This tungsten silicide layer is formed by means of a CVD process using a mixture of silane ($SiH_4$), tungsten hexafluoride and hydrogen, the silane being provided for growth rate enhancement. It was reported that the silane chemistry is effective in reducing fluorine incorporation in the underlying titanium layer. However, this blanket deposition approach appeared to be rather unsuccessful in that it did not provide adhesion at the one-micron diameter contact level.

OBJECTS OF THE INVENTION

It is an object of the invention to provide a method that merges into a single process the use of a metal silicide for establishing a contact with silicon and the use of a conductive material for filling a contact hole in a reliable way without damaging the silicon contacting silicide. It is a further object of the invention to provide a method for manufacturing a semiconductor device having reliable and low-resistance contacts, especially in the sub-micron region. It is another object of the invention to provide a silicon semiconductor device with reliable and low resistance contacts and interconnections.

GENERAL DISCLOSURE OF THE INVENTION

A method according to the invention therefore comprises the following steps:

forming (a) a first layer that is electrically coupled to the semiconductor material and that comprises a silicide of a first conductive material, and (b) a second layer over the first layer and electrically coupled to the first layer. The second layer comprises a silicide of a second conductive material, different from the first conductive material. The formation of the second layer does not involve any substance that individually is able to chemically deteriorate the electrical coupling between the first and second layers;

forming over the second layer and being electrically coupled thereto a third layer comprising a third conductive material. The second layer functions as an adhesion layer for the third layer and protects the first layer against chemical deterioration by a substance that is involved in the forming of the third layer.

The materials are to be chosen such as to comply with the following requirements: the layers should provide an adequately conductive coupling with the silicon; each layer should act as an adequate adhesion layer for the succeeding layer; neither the materials used in a particular step nor the formation itself of the associated layer should detrimentally interfere with the conductive characteristics of the preceding layer. For instance, the use of CVD-tungsten or CVD-molybdenum in the formation of the third layer preferably entails fluorine chemistry. The second silicide layer should therefore protect the first silicide layer from being degraded by fluorine compounds while offering good adhesion to both the underlying first layer and the overlying CVD-tungsten layer.

Furthermore, in a distinctive embodiment of a method according to the invention the materials used preferably have such properties that the formation of the conductive region is established in a self-aligned manner.

Particular embodiments of a method according to the invention are those wherein the formation of the first layer involves deposition of at least one of the following materials: titanium and cobalt; wherein the formation of the second layer includes physical vapor deposition of at least one of the following: molybdenum and tungsten; and wherein the formation of the third layer includes chemical vapor deposition of at least one of the following: tungsten and molybdenum.

The physical vapor deposition, such as sputtering or vacuum evaporation, of molybdenum or tungsten is compatible with the CVD-tungsten step and CVD-molybdenum step since the associated silicide generated during subsequent annealing will function as a nucleation layer. For compatibility with a tungsten polycide process, sputtered tungsten is favored.

It should be noted that the blanket CVD-tungsten process in Ellwanger employs a CVD-tungsten-silicide step for forming an adhesion promoting layer to oxide with the help of silane that functions, among others, as some sort of a palliative for reducing fluorine damage to the underlying titanium silicide layer. In contrast, a method according to the invention avoids right from the start the use of any substance in the formation of the second layer that may have damaging effects on the first layer.

Furthermore, Ellwanger uses a blanket CVD-tungsten process wherein the adhesion of the tungsten blanket to the oxide or other dielectric material represents an important criterion for the selection of the various materials and process parameters. In a preferred embodiment of a method according to the invention, the CVD-process is of the selective type wherein the deposition of the metal does not occur on dielectric material. This selective type process involves globally different layer materials and process parameters.

Moreover, Ellwanger reports loss of adhesion at the one-micron diameter contact level and attributes this to the adhesion properties of the tungsten silicide that was grown in his CVD-tungsten process, whereas in an embodiment according to the invention the second layer is created through a physical deposition of tungsten followed by an anneal step.

BRIEF DESCRIPTION OF THE DRAWING

The invention will be explained hereinafter by way of example and with reference to the accompanying drawings in which.

DETAILED DESCRIPTION OF THE DRAWING

Figure 1:
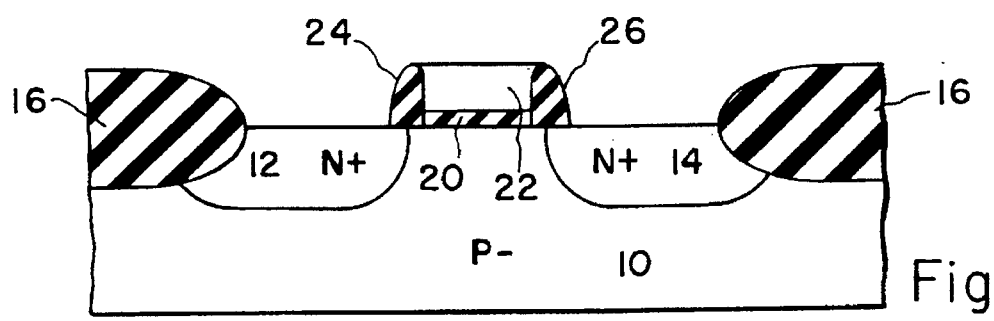
FIGS. 1 to 7 show a sequence of steps in a method according to the invention. Throughout the figures like reference numerals indicate identical or corresponding features.

FIG. 1 shows by way of example a cross-section of a part of a silicon semiconductor P-type substrate 10 that includes N-doped regions 12 and 14 that will become the source region and the drain region of an N-channel field effect transistor, an annular thermally grown oxide region 16, a dielectric layer 20 electrically isolating substrate 10 from a polysilicon portion 22 that will become the gate of the transistor, and oxide sidewall spacers 24 and 26. Typically, the feature dimensions are on the order of 1 micron or less. It should be noted that only for the purpose of visualizing the invention the locations wherein contacts will be formed to the drain, source and gate, are shown to lie in the same cross-section, whereas in general the contacts for drain, source and gate lie mutually staggered on the surface for saving substrate area. Also, although the drawings relate to an N-channel field effect device, the invention applies as well to P-channel field effect and to bipolar devices.

A layer of titanium is deposited on top of the structure in FIG. 1, preferably in an argon environment by means of sputtering or vacuum evaporation. Other ways of depositing titanium may include CVD. The thickness of this layer is typically in the range of 100–1000 angstroms. A rapid (1 to 120 sec.) thermal anneal step in a nitrogen-containing environment at a temperature of 600° C.–700° C. is performed. The rapid thermal anneal causes the titanium overlying the silicon to form a lower layer of high-resistive titanium silicide and an upper layer of a titanium-nitrogen-oxygen compound, whereas the titanium overlying the oxide does not react with the oxide. The titanium overlying the oxide forms only a titanium-nitrogen-oxygen compound. Instead of a rapid thermal anneal, a conventional anneal step may be carried out in a nitrogen-containing environment at a temperature between 500° C.–700° C. for about 15 minutes to 1 hour.

Figure 2:
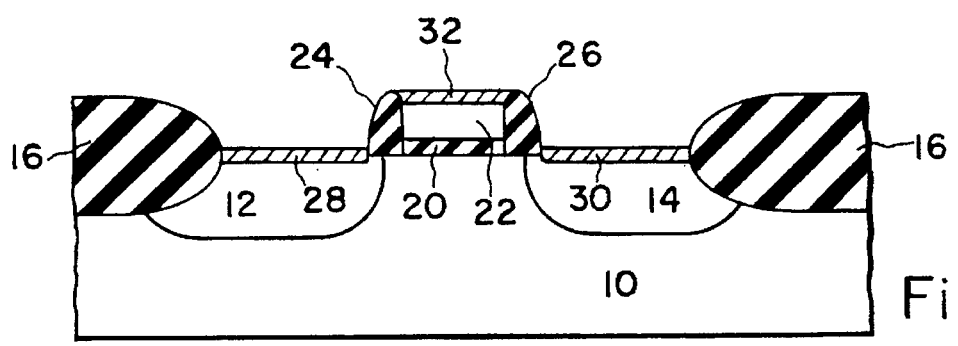

A selective strip of the titanium-nitrogen-oxygen compound leaves behind self-aligned areas of high-resistivity titanium silicide overlying the silicon. A second thermal anneal step is performed in, for instance, a nitrogen-containing or an argon-containing, oxygen-free environment at a temperature of about 700° C.–900° C. to transform the high-resistivity titanium silicide into low-resistive titanium silicide. The result is shown in FIG. 2, wherein low-resistivity titanium silicide layers 28, 30 and 32 respectively cover the silicon areas 12, 14 and 22.

Next an electrically insulating layer, for example, a silicon oxide layer, a phosphosilicate glass layer (PSG), a borosilicate glass layer (BSG), a boron-doped phosphosilicate glass layer (BPSG), a plasma oxide layer or a plasma silicon nitride layer, is formed over the substrate. The thickness of this dielectric layer is typically 3000–10000 angstroms. If necessary, the dielectric layer may be planarized with various techniques. In case of a PSG-, a BSG- or a BPSG-layer a thermal anneal may be employed to flow and thus planarize the glass. Other techniques include photoresist etchback planarization, spin-on glass (SOG) planarization and planarization by mechanical polishing.

Figure 3:
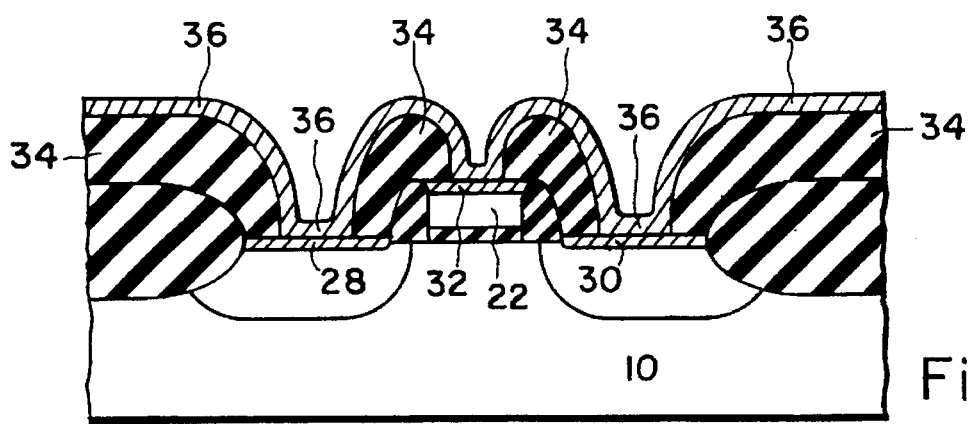

In this dielectric layer contact openings are formed by means of etching, typically using photoresist as mask. Thereafter the substrate is covered with a layer of tungsten, for instance by means of sputtering. Typically, the thickness of the tungsten layer is 100–1000 angstrom. It should be noted that titanium silicide etches very fast in hydrogen fluoride-based solutions usually used before metal deposition thereon. Therefore the conventional dip in the diluted HF solution should not be done. Instead, a sputter etch step may be performed prior to molybdenum deposition if necessary. In FIG. 3 oxide layer 34 and the titanium silicide layers 28, 30 and 32 at the bottom of the contact holes are covered by tungsten layer 36.

Thereupon tungsten silicide formation is accomplished by thermal anneal, resulting in tungsten silicide layers on top of titanium silicide layers 28, 30 and 32, and an unreacted tungsten layer over oxide layer 34. It should be mentioned that the tungsten silicide formation from silicon and tungsten is facilitated by the interposed titanium silicide. The reason for this is that the direct formation of tungsten silicide at the tungsten/silicon interface can be retarded by the presence of a thin silicon oxide layer. The thin silicon oxide is readily reduced due to the titanium. The presence of titanium silicide also reduces the thermal energy that is necessary for removing silicon from the silicon substrate to form tungsten silicide.

Figure 4:
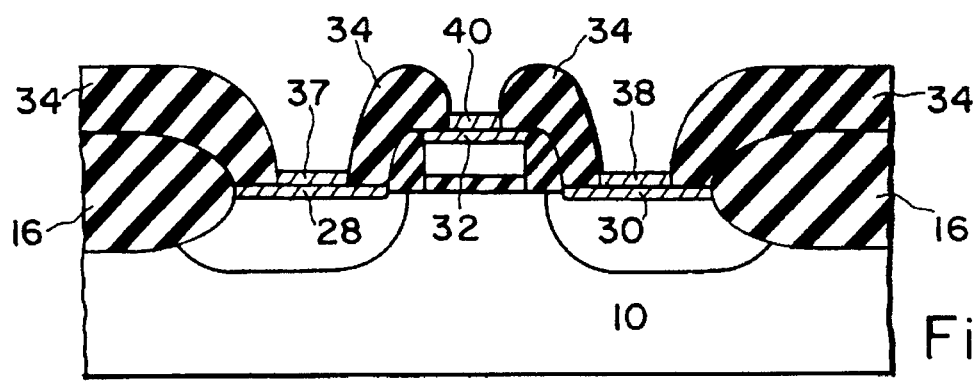

The temperature at which tungsten silicide forms during annealing should lie approximately between 600° C. and 900° C. At a temperature substantially lower than 600° C. no tungsten silicide formation occurs, whereas at a temperature higher than 900° C. intermixing of silicon, titanium and tungsten and intermixing of tungsten and oxide develops. The tungsten that overlays oxide layer 34 is selectively removed, for instance, by means of a selective etching solution. The result is shown in FIG. 4, wherein tungsten silicide layers 37, 38 and 40 respectively cover titanium silicide layers 28, 30 and 32.

Subsequently, a selective CVD of tungsten is carried out causing a growth of tungsten on top of tungsten silicide layers 37, 38 and 40. The CVD tungsten uses tungsten hexafluoride/hydrogen or tungsten hexafluoride/argon as a source gas. The deposition temperature preferably lies in the range of 200° C.–700° C., the deposition pressure lies substantially between 0.01 torr and 100 torr, and the deposition time ranges from substantially 1 minute to 4 hours.

Figure 5:
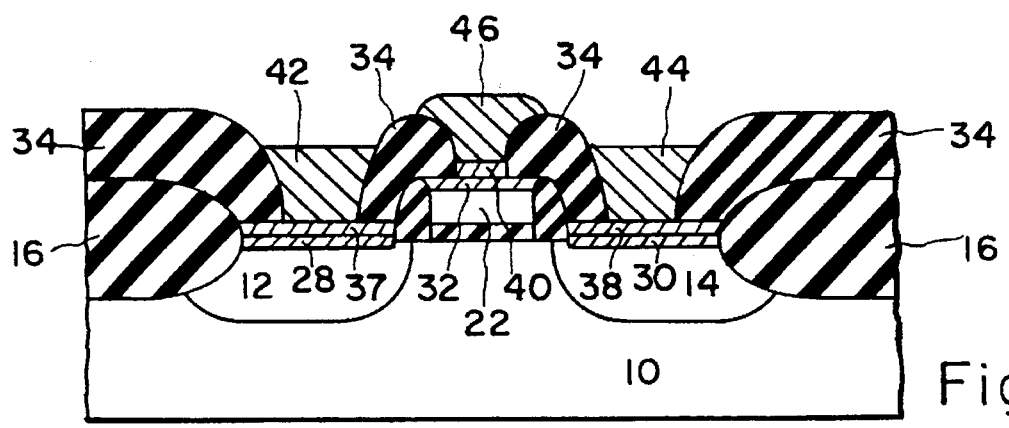
Figure 6:
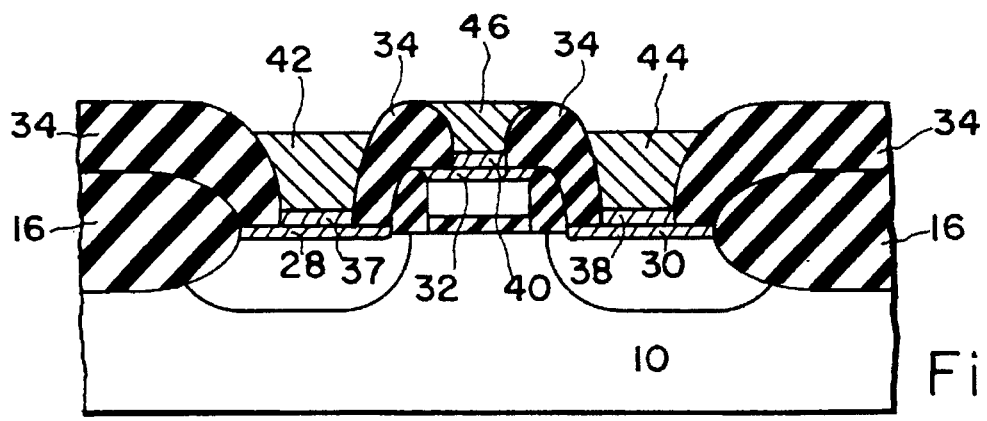

As has been mentioned before, no non-volatile fluoride compound forms. The result of the tungsten filling of the contact holes is shown in FIG. 5, wherein layers of tungsten 42, 44 and 46 are deposited on top of the tungsten silicide layers 37, 38 and 40, respectively. In the shown case the contact hole to the polysilicon 22 is shallower than the contact holes to the doped regions 12 and 14. As a consequence, the tungsten layer 46 has an outgrown part overtopping oxide layer 34. This part may be removed by a conventional resist etchback approach if the difference in height is unacceptable for some reason. The result after the resist etchback is shown in FIG. 6.

Figure 7:
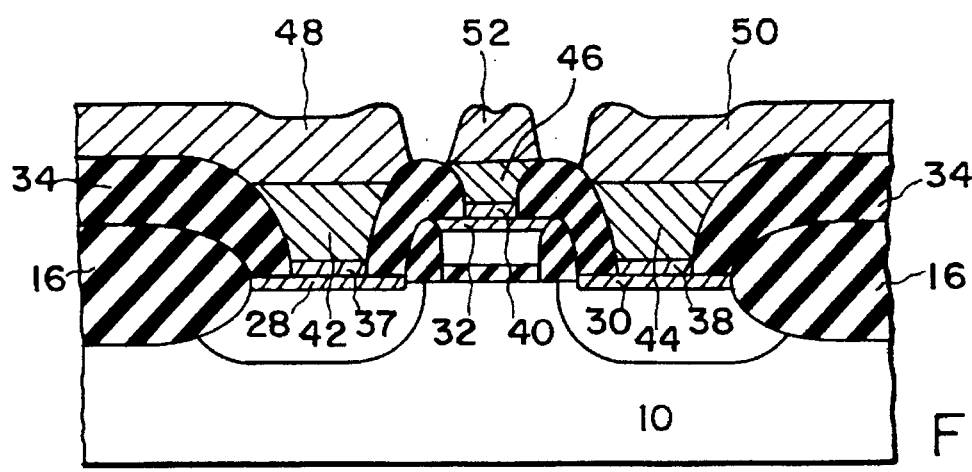

Finally, FIG. 7 shows for the sake of completeness parts of interconnects 48, 50 and 52 contacting respectively the tungsten layers 42, 44 and 46. The interconnects 48, 50 and 52 are formed, for instance, by depositing aluminum or an aluminum alloy. The major alloying materials include silicon, copper, titanium and tungsten. The interconnects may also be formed by using other well-conducting materials, such as copper or gold.

A prominent feature of the above example is that the titanium silicide, the tungsten silicide and the selective tungsten fill through the CVD process all are formed in a self-aligned manner. Furthermore, the titanium silicide that was formed in a self-aligned way serves a major function of lowering the resistances of monocrystalline silicon and polycrystalline silicon interconnects. As already mentioned, the titanium silicide also reduces the contact resistance.

Several variations on the theme of the invention are feasable with regard to the materials used and the sequence of steps executed. As has been mentioned before, instead of titanium silicide in the first layer, cobalt silicide may be formed. Substantially the same anneal temperature and layer thickness apply as for the titanium silicide formation discussed above.

Also, instead of tungsten silicide in the second layer, physically deposited molybdenum may be used for the formation of the second layer. The anneal temperature for the formation of molybdenum silicide should lie between 500° C. and 800° C. Below 500° C. no silicide is formed, whereas above 800° C. undesired intermixing of silicon, titanium or cobalt, and molybdenum occurs.

Instead of the CVD step involving tungsten for the third layer, a CVD step involving molybdenum may be used with molybdenum hexafluoride/hydrogen or molybdenum hexafluoride/argon as a source gas. The deposition temperature should lie substantially between 200° C. and 500° C. The deposition time typically lies on the order of 5 minutes–1 hour. The deposition pressure lies in the typical range of 0.1–10 torr.

Also, the sequence of steps may be altered. Initially, the first layer was formed over the silicon, a dielectric layer with contact openings was formed over the first layer, the second layer was formed and finally the third layer was formed. Alternatives for the above example are given below.

A first alternative incorporates forming a dielectric layer with contact openings over the silicon, performing a physical vapor deposition of the first conductive material, executing a first thermal anneal, performing a selective strip of the non-silicided portion of the conductive material, executing a second physical vapor deposition of the second conductive material, executing a second thermal anneal, performing a selective strip of the non-silicided portion of the second material and finally carrying out a chemical vapor deposition of the third conductive material. This first alternative may apply when the resistance of the silicides is not critical, for example, in interconnects. The interconnect's overall resistance is determined by the third conductive material in a parallel arrangement with the first and the second layers. Consequently, the additional anneal step for further reducing the resistivity of the relevant silicide, as mentioned in the illustrated example, may be left out.

In a related second alternative, the anneal steps required for the formation of the first and second layers may be combined into a single anneal step after deposition of the first and second conductive materials at a temperature that enables the relevant silicides to be formed and avoids the intermixing as mentioned above. Subsequently, the selective strip of the non-silicided portion of the second conductive material precedes the selective strip of the non-silicided portion of the first conductive material. Finally, the third conductive material is deposited.

A third alternative includes a physical vapor deposition of the first conductive material on the substrate, after which a first thermal anneal and a selective strip of the non-silicided portion of the conductive material are carried out. Thereupon the second conductive material is deposited followed by a second anneal step and a selective strip of the non-silicided portion of this material. Thereafter the third conductive material is deposited followed by the formation of a dielectric layer having contact openings that are again filled by the third conductive material. Again, in a related fourth alternative, the required anneal steps for forming the first and second layers may be combined into a single one.

A fifth alternative includes a physical vapor deposition of the first conductive material on the substrate followed by a first thermal anneal, a physical vapor deposition of the second conductive material, and a second thermal anneal. A dielectric layer is then formed with contact holes that are filled by means of a chemical vapor deposition of the third conductive material. In a related sixth alternative the thermal anneal steps may again be replaced by a single one after depositing the first and second conductive materials.

It should be noted that, though the above scenarios have been presented by way of example as related to the formation of a (vertical) contact, they also apply to the formation of a horizontal interconnect. However, for an interconnect (or a so-called via) the scheme given in the figures may be simplified by dispensing with the second thermal anneal of the titanium silicide for the transformation into a low-resistive silicide. The reason for this is that the interconnect formed by a layered structure according to the invention electrically constitutes a parallel arrangement of three resistances of which the lowest value is represented by the third layer and of which the highest value is represented by the first or the second layer. In the via structure the additional anneal step for the first layer would not contribute significantly to a decrease in the aggregated resistance. The additional advantage of the third and fourth alternatives using tungsten or molybdenum in the third layer is that these materials function as an etchstop when local interconnects or straps are used in circuits.

It should be mentioned that, although the figures demonstrate a self-aligned process as regards the metallization steps, the method according to the invention is not limited to self-alignedness. Also, though the figures show an example with regard to the realization of a field effect transistor, the method according to the invention extends to the formation of contact hole fills for all kinds of silicon semiconductor devices.

What is claimed is:

1. A method of forming electrically conductive contacts to a surface of silicon semiconductor material comprising the steps of
   (a) forming a first silicide layer of a first conductive material on the surface of the silicon semiconductor material;
   (b) forming a second different silicide layer of a second different conductive material on said first silicide layer by physical vapor deposition, said second silicide layer being formed by substances that individually are chemically inert to said first silicide layer; and
   (c) forming a third electrically conductive layer of a third conductive material on said second silicide layer by chemical vapor deposition, said third conductive layer being electrically coupled to said second silicide layer, said third conductive layer being adhesively connected to said first silicide layer by said second silicide layer, and said first silicide layer being protected from any chemical employed in said chemical vapor deposition of said third conductive layer by said second silicide layer, wherein said first silicide layer, said second silicide layer and said third conductive layer are formed in a self-aligned manner on said surface of silicon semiconductor material.

2. A method according to claim 1, wherein said step (c) is carried out by using selective chemical vapor deposition of said third conductive material from a fluorine compound.

3. A method according to claim 2, wherein said first silicide layer is formed from at least one of titanium and cobalt as said first conductive material.

4. A method according to claim 3, wherein said second different silicide layer is formed from at least one of molybdenum and tungsten as said second different conductive material.

5. A method according to claim 1, wherein said first silicide layer is formed from at least one of titanium and cobalt as said first conductive material.

6. A method according to claim 1, wherein said second different silicide layer is formed from at least one of molybdenum and tungsten as said second different conductive material.

7. A method according to claim 1, wherein each of step (a) and step (b) include annealing said respective first conductive material and said second different conductive material upon being respectively placed into position on said silicon semiconductor material and said first conductive material.

8. A method according to claim 1, wherein before carrying out said step (a) a dielectric layer having at least one contact hole is formed on said surface of said silicon semiconductor material.

9. A method according to claim 1, wherein between said step (a) and said step (b) a dielectric layer having at least one contact hole is formed on said first silicide layer.

10. A method according to claim 1, wherein between said step (b) and said step (c) a dielectric layer having at least one contact hole is formed on said second different silicide layer.

11. A method according to claim 1, wherein after said step (c) is carried out a dielectric layer having at least one contact hole is formed on said third electrically conductive layer.

12. A method according to claim 1, wherein said first silicide layer serves to reduce resistance with and of said silicon semiconductor material.

13. A method according to claim 1, wherein after said step (c), interconnects are formed to said third electrically conductive material.

* * * * *